United States Patent
Wang

(10) Patent No.: US 11,619,457 B2
(45) Date of Patent: Apr. 4, 2023

(54) THERMAL CONTROLLER, THERMAL CONTROL SYSTEM AND THERMAL CONTROL METHOD FOR HARDWARE DEVICES

(71) Applicant: Hand Held Products, Inc., Charlotte, NC (US)

(72) Inventor: Fei Wang, Shenzhen (CN)

(73) Assignee: HAND HELD PRODUCTS, INC., Charlotte, NC (US)

( * ) Notice: Subject to any disclaimer, the term of this patent is extended or adjusted under 35 U.S.C. 154(b) by 34 days.

(21) Appl. No.: 17/247,460

(22) Filed: Dec. 11, 2020

(65) Prior Publication Data

US 2022/0163273 A1 May 26, 2022

(30) Foreign Application Priority Data

Nov. 23, 2020 (CN) .......................... 202011319344.0

(51) Int. Cl.
*F28F 27/00* (2006.01)
*F28F 13/00* (2006.01)
*F28F 3/00* (2006.01)

(52) U.S. Cl.
CPC ................ *F28F 27/00* (2013.01); *F28F 3/00* (2013.01); *F28F 13/00* (2013.01); *F28F 2013/006* (2013.01)

(58) Field of Classification Search
CPC .................. F28F 13/00; F28F 2013/005; F28F 2013/006; F28F 2013/008; G05D 23/08; H01M 10/61
See application file for complete search history.

(56) References Cited

U.S. PATENT DOCUMENTS

| | | | |
|---|---|---|---|
| 10,446,464 B2 * | 10/2019 | Iijima | .................. H01L 23/3736 |
| 2009/0194520 A1 | 8/2009 | Lin et al. | |
| 2015/0125719 A1 | 5/2015 | Hongo | |

FOREIGN PATENT DOCUMENTS

| CN | 108511847 A | 9/2018 |
|---|---|---|
| CN | 108550958 A | 9/2018 |

* cited by examiner

*Primary Examiner* — Jianying C Atkisson
*Assistant Examiner* — Khaled Ahmed Ali Al Samiri
(74) *Attorney, Agent, or Firm* — Alston & Bird LLP

(57) ABSTRACT

Embodiments of the disclosure relate generally to thermal control and management in hardware devices. A thermal control system includes a thermal node, a thermal bridge, and a thermal controller. The thermal node is configured to receive heat generated in a device. The thermal controller is configured to in response to an environment temperature of the thermal controller being greater than a first threshold temperature, cause heat transfer from the thermal node to a first heat sink and prevent heat transfer from the thermal node to a second heat sink. The thermal controller is also configured to, in response to the environment temperature of the thermal controller being greater than a second threshold temperature, cause heat transfer from the thermal node to the second heat sink and prevent heat transfer from the thermal node to the first heat sink.

6 Claims, 7 Drawing Sheets

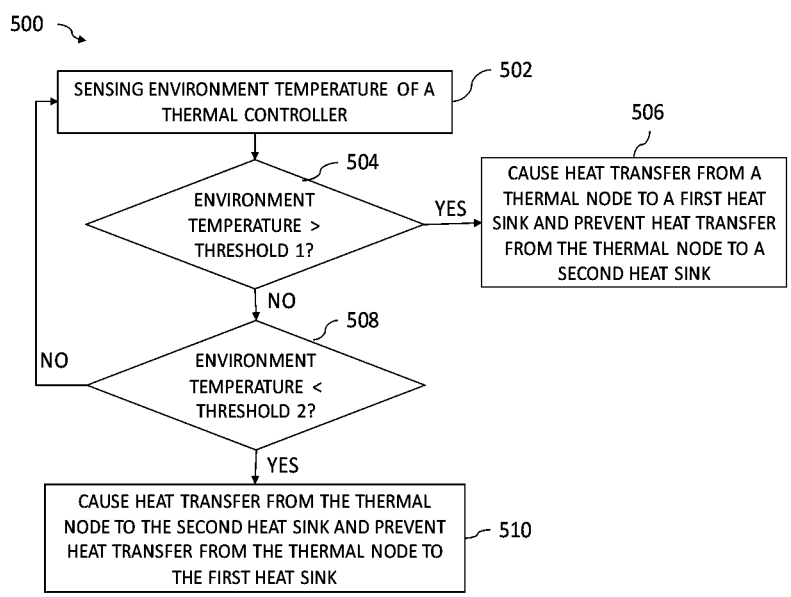

THERMAL CONTROLLER, THERMAL CONTROL SYSTEM AND THERMAL CONTROL METHOD FOR HARDWARE DEVICES

CROSS REFERENCE TO RELATED APPLICATIONS

This application claims priority to and the benefit of foreign Chinese Patent Application Serial No. 202011319344.0, filed on Nov. 23, 2020 and entitled "Thermal Controller, Thermal Control System And Thermal Control Method For Hardware Devices," each of which is incorporated herein by reference in its entirety.

TECHNOLOGICAL FIELD

Embodiments of the present disclosure generally relate to heat management in a device and more particularly to a thermal controller, a thermal control system and method for effective heat control in a thermally sensitive device.

BACKGROUND

Hardware devices including mechanical, thermal, and/or electrical components have become widespread today. Almost every task in day to day routine involves one or the other type of hardware devices. The performance of such devices is restricted to a specified range of temperature for effective and smooth operation. However, oftentimes long operating hours or extreme working conditions lead to challenging situations which pose serious threat to such devices. For example, electronic devices which have several thermally sensitive components may witness degradation in performance when the devices are operated near or outside the prescribed limits. At times, such degradation in performance may eventually lead to a situation where one or more capabilities of the device may be compromised or even completely disabled.

SUMMARY

In general, embodiments of the present disclosure provided herein are configured for thermal control and heat management in hardware devices. Other implementations for device's thermal safety and prevention from thermal damage will be, or will become, apparent to one with skill in the art upon examination of the following figures and detailed description. It is intended that all such additional implementations be included within this description, be within the scope of the disclosure, and be protected by the following claims.

In accordance with some example embodiments, provided herein is a thermal control system. In an example embodiment, the thermal control comprises a thermal node, a thermal bridge, and a thermal controller. The thermal node is configured to receive heat generated in a device. The thermal bridge is thermally coupled with the thermal node. In some example embodiments, the thermal controller is configured to, in response to an environment temperature of the thermal controller being greater than a first threshold temperature, cause heat transfer from the thermal node to a first heat sink by thermal coupling of the thermal bridge with the first heat sink and prevent heat transfer from the thermal node to a second heat sink by thermal decoupling of the thermal bridge with the second heat sink. In some example embodiments, the thermal controller is also configured to, in response to the environment temperature of the thermal controller being greater than a second threshold temperature, cause heat transfer from the thermal node to the second heat sink by thermal coupling of the thermal bridge with the second heat sink and prevent heat transfer from the thermal node to the first heat sink by thermal decoupling of the thermal bridge with the first heat sink.

Additionally or alternatively, in some embodiments of the thermal control system, the thermal bridge comprises a first arm and a second arm. In some example embodiments, each of a first end of the first arm and a second end of the second arm is thermally coupled with the thermal node. In some example embodiments, a third end of the first arm is thermally couplable with the first heat sink and a fourth end of the second arm is thermally couplable with the second heat sink.

Additionally or alternatively, in some embodiments of the thermal control system, the thermal controller comprises a thermally sensitive deformable body. In some example embodiments of the thermal control system, the thermally sensitive deformable body comprises one or more of Polybutylene or Polyethylene.

Additionally or alternatively, in some embodiments of the thermal control system, the thermally sensitive deformable body is between the first arm of the thermal bridge and the second arm of the thermal bridge towards the first end of the first arm of the thermal bridge.

Additionally or alternatively, in some embodiments of the thermal control system, in response to the environment temperature of the thermally sensitive deformable body being greater than the first threshold temperature, the thermally sensitive deformable body is configured to expand such that the second end of the first arm is thermally coupled with the first heat sink to transfer heat from the thermal node to the first heat sink via the first arm of the thermal bridge.

Additionally or alternatively, in some embodiments of the thermal control system, in response to the environment temperature of the thermally sensitive deformable body being greater than the first threshold temperature, the thermally sensitive deformable body is further configured to expand such that the fourth end of the second arm is thermally decoupled from the second heat sink to prevent transfer of heat from the thermal node to the second heat sink via the second arm of the thermal bridge.

Additionally or alternatively, in some embodiments of the thermal control system, in response to the environment temperature of the thermally sensitive deformable body being less than the second threshold temperature, the thermally sensitive deformable body is configured to contract such that the fourth end of the second arm is thermally coupled with the second heat sink to transfer heat from the thermal node to the second heat sink via the second arm of the thermal bridge.

Additionally or alternatively, in some embodiments of the thermal control system, in response to the environment temperature of the thermally sensitive deformable body being less than the second threshold temperature, the thermally sensitive deformable body is further configured to contract such that the second end of the first arm is thermally decoupled from the first heat sink to prevent heat transfer from the thermal node to the first heat sink via the first arm of the thermal bridge.

Additionally or alternatively, in some embodiments of the thermal control system, the thermal controller comprises a thermal sensor configured to sense the environment temperature of the thermal controller and an actuation mechanism configured to actuate the thermal bridge in response to the sensed environment temperature.

Additionally or alternatively, in some embodiments of the thermal control system, the actuation mechanism comprises a servo motor positioned between the first arm of the thermal bridge and the second arm of the thermal bridge towards the first end of the first arm of the thermal bridge.

Additionally or alternatively, in some embodiments of the thermal control system, in response to the environment temperature sensed by the thermal sensor being greater than the first threshold temperature, the actuation mechanism is configured to extend the first arm of the thermal bridge such that a first end of the first arm is thermally coupled with the first heat sink to transfer heat from the thermal node to the first heat sink via the first arm of the thermal bridge.

Additionally or alternatively, in some embodiments of the thermal control system, in response to the environment temperature sensed by the thermal sensor being greater than the first threshold temperature, the actuation mechanism is further configured to extend the second arm of the thermal bridge such that a second end of the second arm is thermally decoupled from the second heat sink to prevent heat transfer from the thermal node to the second heat sink via the second arm of the thermal bridge.

Additionally or alternatively, in some embodiments of the thermal control system, in response to the environment temperature sensed by the thermal sensor being less than the second threshold temperature, the actuation mechanism is configured to retract the second arm of the thermal bridge such that a first end of the second arm is thermally coupled with the second heat sink to transfer heat from the thermal node to the second heat sink via the second arm of the thermal bridge.

Additionally or alternatively, in some embodiments of the thermal control system, in response to the environment temperature sensed by the thermal sensor being less than the second threshold temperature, the actuation mechanism is configured to retract the first arm of the thermal bridge such that a second end of the first arm is thermally decoupled from the first heat sink to prevent heat transfer from the thermal node to the first heat sink via the first arm of the thermal bridge.

Additionally or alternatively, in some embodiments of the thermal control system, the thermal bridge comprises at least one of copper, silver, Beryllium oxide. or Boron arsenide.

Additionally or alternatively, in some embodiments of the thermal control system, the thermal node is configured to receive the heat generated in the device from one or more power consumption equipment associated with the device.

Additionally or alternatively, in some embodiments of the thermal control system, the thermal bridge is Y-shaped. In some example embodiments, the thermal bridge comprises a first arm thermally coupled with the thermal node, a second arm thermally couplable with the first heat sink, and a third arm thermally couplable with the second heat sink. In some example embodiments, the first arm, the second arm, and the third arm protrude from a common node on the thermal bridge.

In some example embodiments, a thermal control device is provided. In some example implementations the thermal control device comprises a thermal bridge having a first arm, a second arm, and a third arm. In some example embodiments, the first arm of the thermal bridge is thermally couplable with a heat source, the second arm of the thermal bridge is thermally couplable with a first heat sink, and the third arm is thermally couplable with a second heat sink, In some example embodiments, the thermal control device also comprises a thermally sensitive deformable body configured to cause thermal coupling for heat transfer between the heat source and the first heat sink via the thermal bridge and cause thermal decoupling to prevent heat transfer between the heat source and the second heat sink via the thermal bridge.

In some example embodiments, a thermal control device is provided. The thermal control device comprises a thermal bridge and a thermally sensitive deformable body. In some example embodiments, the thermal bridge is thermally couplable with a heat source, a first heat sink, and a second heat sink. The thermally sensitive deformable body is configured to, in response to an environment temperature of the thermally sensitive deformable body being greater than a first threshold temperature, cause heat transfer from the heat source to the first heat sink by thermal coupling of the thermal bridge with the first heat sink via the thermal bridge and prevent heat transfer from the heat source to the second heat sink by thermal decoupling of the thermal bridge with the second heat sink. In some example embodiments, the thermally sensitive deformable body is also configured to, in response to the environment temperature of the thermal controller being greater than a second threshold temperature, cause heat transfer from the heat source to the second heat sink by thermal coupling of the thermal bridge with the second heat sink and prevent heat transfer from the heat source to the first heat sink by thermal decoupling of the thermal bridge with the first heat sink.

BRIEF DESCRIPTION OF THE DRAWINGS

Figure 1:
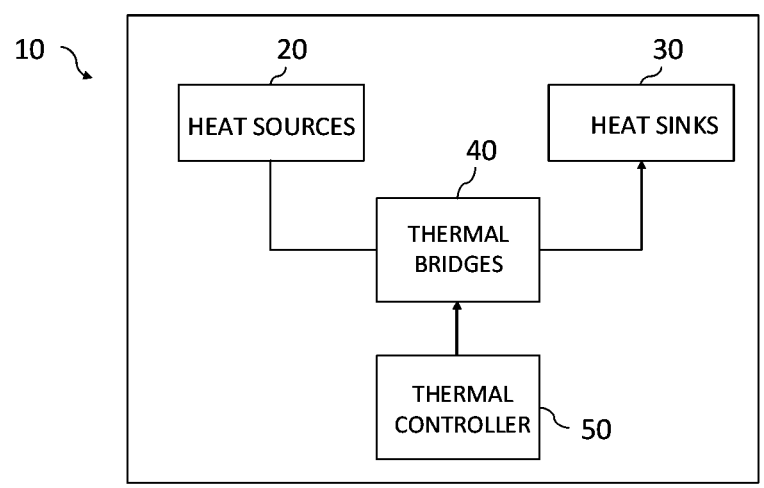
Figure 2A:
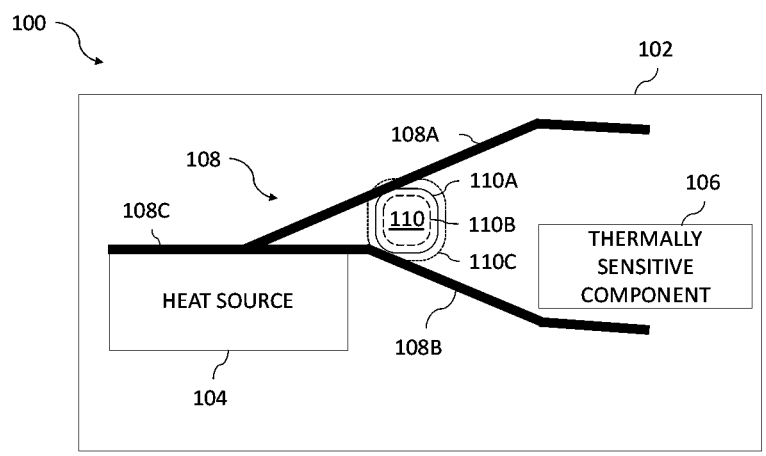
Figure 2B:
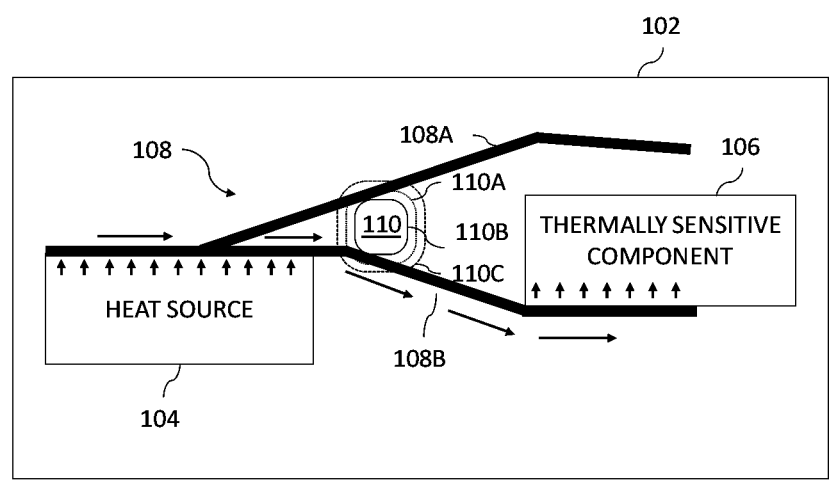
Figure 2C:
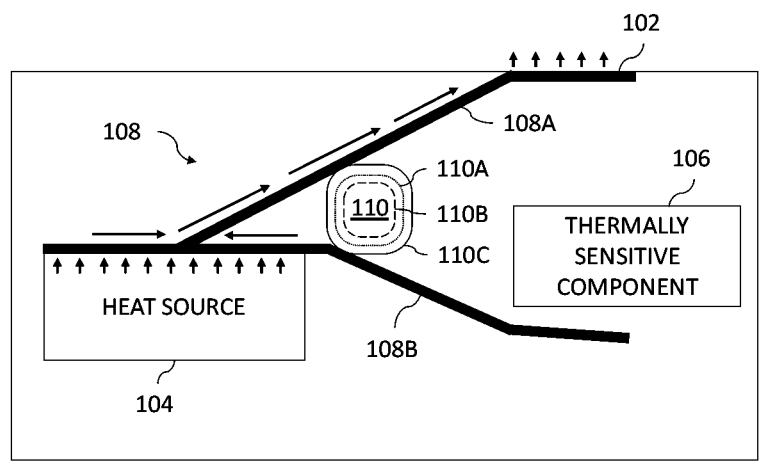
Figure 3:
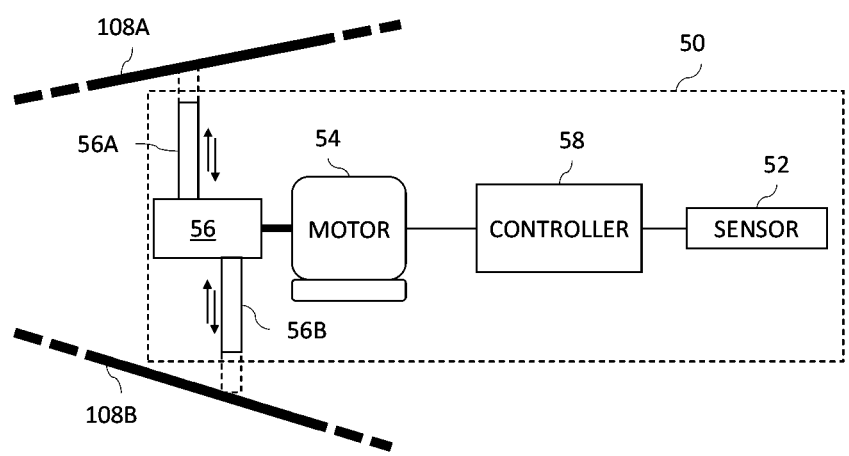
Figure 4:
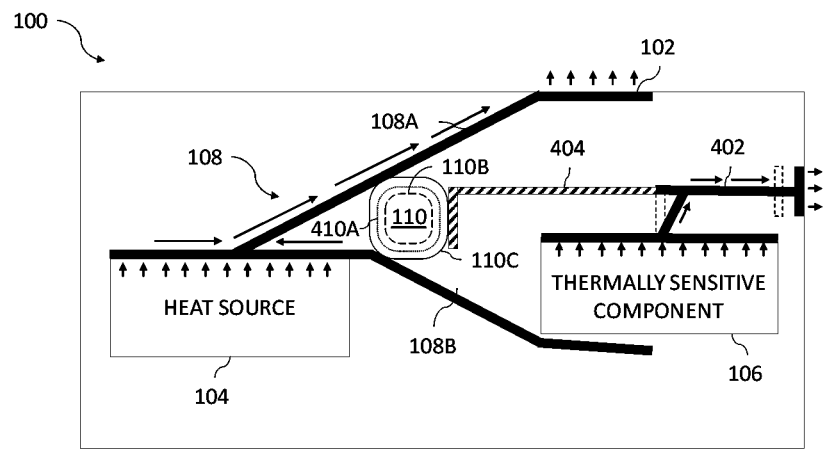

Having thus described the embodiments of the disclosure in general terms, reference now will be made to the accompanying drawings, which are not necessarily drawn to scale, and wherein:

FIG. 1 illustrates a block diagram of an example thermal control system, in accordance with an example embodiment of the present disclosure;

FIG. 2A illustrates an example thermal control system embodied in a device, in accordance with an example embodiment of the present disclosure;

FIG. 2B illustrates a working example of a thermal control system in cold conditions, in accordance with an example embodiment of the present disclosure;

FIG. 2C illustrates a working example of the thermal control system in hot conditions, in accordance with an example embodiment of the present disclosure;

FIG. 3 illustrates an electromechanical thermal controller, in accordance with an example embodiment of the present disclosure;

FIG. 4 illustrates a working example of a thermal control system providing heat drain out of a device, in accordance with an example embodiment of the present disclosure; and FIG. 5 illustrates a flowchart depicting example operations of a process for thermal control in a device, in accordance with an example embodiment of the present disclosure.

DETAILED DESCRIPTION

Embodiments of the present disclosure now will be described more fully hereinafter with reference to the accompanying drawings, in which some, but not all, embodiments of the disclosure are shown. Indeed, embodiments of the disclosure may be embodied in many different forms and should not be construed as limited to the embodiments set forth herein, rather, these embodiments are provided so that this disclosure will satisfy applicable legal requirements. Like numbers refer to like elements throughout.

Hardware devices come in various forms and compositions, most of them including one or more of mechanical, thermal or electrical parts/components. These parts/components during operation produce heat in the device. Owing to the miniaturization of devices in recent times, the heat footprint of the parts/components is further magnified and the rate of heat production in the device exceeds the rate of cooling of the device. For example, in a typical handheld device, there are various electronic components such as ICs, amplifiers which consume power to carry out one or more operations. These components produce heat which requires proper disposal to ensure performance degradation and safe operation of the device. Similarly, in cold conditions extreme temperature drops can cease operation of one or more components of the device. In one non-limiting example, one such temperature sensitive component is a battery whose performance degrades drastically with change in temperature. This is because the rated capacity of batteries is usually based on the room temperature (for example at 25° C.). At temperatures higher than the standard operating range, the battery may swell and even burn out, thus posing a serious threat to the safety of the device and of a user of the device. When the battery is operated at a temperature below the standard operating temperature range, the capacity of the battery falls below the rated capacity. This impacts the user experience of the device. Use of auxiliary heating elements further aggravates the problem due to two main reasons. Firstly, such heating elements draw heavy power thus leaving little battery capacity for the device. Secondly, such solutions merely address one part of the problem, they are not of any use for problems arising out of high temperature operations.

Similarly, in another non-limiting example, an integrated circuit (IC) is also a temperature sensitive component whose performance is affected with operating temperature. In particular, self-heat generated inside these ICs is confined within the device and degrades their performance. In addition, an IC surrounded by multiple adjacent heat generating components may be subject to thermal coupling effect. all these in turn substantially affects the circuit's frequency, dc and time response.

Some embodiments described herein provide efficient thermal control and management for hardware devices. Some embodiments described herein do not require additional heating elements thus ensuring high efficiency. Some embodiments provide precision based thermal control for effective heat management in hardware devices. Some embodiments utilize a thermal controller to control a thermal bridge to couple and decouple with one or more heat sources and one or more heat sinks, thus exhibiting properties like a 'heat switch'. Some embodiments utilize the environment temperature of the thermal controller to actuate the thermal bridge for causing and/or preventing heat transfer between sources and sinks. Some embodiments provide fail proof solution to heat management in a device by utilizing a thermally sensitive deformable body that expands upon increase in temperature and contracts with decrease in temperature. Some embodiments utilize the expansion and contraction of the thermally sensitive deformable body to actuate the thermal bridge.

In some embodiments, the thermal bridge is a bi-pronged 'Y' shaped thermally conductive bridge. In this regard, one arm of the thermal bridge may be coupled directly with a heat source in the device or via a thermal node. The other two arms (each prong) of the thermal bridge may be extendable and retractable along one or more dimensions. Each of the two prongs is thermally couplable with a respective heat sink. In some embodiments, one heat sink may dispose the heat to the housing of the device so that the heat is dissipated out of the device. In some embodiments, the other heat sink may dispose the heat to one or more thermally sensitive components inside the device.

Some embodiments are directed to an arrangement in which heat is transferred from one or more heat sources in the device to out of the device when the environment temperature of the thermal controller exceeds an upper limit of an operating temperature range of the device to protect the device from overheating and/or prevent performance degradation, whereas when the environment temperature of the thermal controller is less than a lower limit of the operating temperature range of the device, heat is transferred from the one or more heat sources to one or more thermally sensitive components inside the device to prevent performance degradation.

Such embodiments provide effective thermal control and protection from thermal damage to the device and its various components. Also, since performance of most of the components in a device deteriorates with change in temperature, the embodiments described herein provide an effective solution to retain the desired performance levels even when the environment temperature of the device changes. A device implementing the proposed solutions would thus witness improvement in its overall functionality and would thus become an improved hardware device.

In some embodiments, some of the operations above may be modified or further amplified. Furthermore, in some embodiments, additional optional operations may be included. Modifications, amplifications, or additions to the operations above may be performed in any order and in any combination.

Many modifications and other embodiments of the disclosure set forth herein will come to mind to one skilled in the art to which this disclosure pertains having the benefit of the teachings presented in the foregoing description and the associated drawings. Therefore, it is to be understood that the embodiments are not to be limited to the specific embodiments disclosed and that modifications and other embodiments are intended to be included within the scope of the appended claims. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

Definitions

The term "hardware device" refers to any device configured using one or more components. In some example embodiments the hardware device may be a machine having one or a combination of thermal, mechanical or electrical parts/components.

The term "thermal node" refers to a node that receives heat from one or more heat sources and/or heat carriers in the hardware device. In a non-limiting example context of an electronic device, the thermal node may receive heat from components such as processors, controllers, PMUs, power amplifiers, etc. or from thermal ducts connected to such components.

The term "thermal bridge" refers to a thermally conductive element that serves as a heat transfer path between a heat source or carrier and a heat sink. In some example embodiments, the thermal bridge may be movable along one or more dimensions.

The term "thermal controller" refers to an apparatus or component that controls the thermal bridge to cause and/or prevent heat transfer in the hardware device. The thermal controller may be realized using one or a combination of electronic, non-electronic and mechanical elements. The thermal controller has a high sensitivity to temperature variations and swings into action if the temperature is outside an operating range or working range.

The term "thermal source" or "heat source" refers to one or more elements that are at a higher thermodynamic potential in comparison to one or more other elements in the hardware device. The thermal source may produce self-heat or may receive heat from another heat producing element.

The term "thermal sink" or "heat sink" refers to one or more elements that serve as heat dissipators or absorbers. In some example embodiments, the heat sink may be a passive heat exchanger that transfers the heat generated by an electronic or a mechanical component to a medium such as metal, air or a liquid coolant.

The term "thermally sensitive component" refers to any component of a hardware device that is structurally, compositionally or functionally sensitive to heat. For example, the thermally sensitive component may be a battery for a device whose composition and performance is affected due to change in operating temperature. In some example embodiments, the thermally sensitive component may be a chemical compound, mixture, or alloy that is structurally and/or compositionally sensitive to heat.

The term "thermally couplable" refers to the ability of a structure to couple with another structure to cause heat transfer.

FIG. 1 illustrates a block diagram of an example thermal control system in accordance with an example embodiment of the present disclosure. The thermal control system 10 includes one or more heat sources 20, one or more heat sinks 30, one or more thermal bridges 40, and a thermal controller 50. In some example embodiments, the thermal control system 10 may include fewer or more components than shown in FIG. 1. The thermal control system 10 may be configured to provide thermal control for causing and/or preventing heat transfer in a hardware device. Accordingly, in some example embodiments of the disclosure, the thermal control system 10 may be embodied as a hardware device or as a modular component for the hardware device.

The one or more heat sources 20 may be or correspond to heat sources in a hardware device. For example, in the example context of an electronic device the heat sources may be one or more heat producing elements. The heat producing elements may be power consumption elements such as power amplifiers, controllers, CPUs etc. or energy sources such as transformers, batteries and the like. The one or more heat sources 20 may be the primary source of heat generated in a device of which they may be a part of. The heat generated by the one or more heat sources 20 requires proper disposal so as to maintain the overall thermal profile of the device within permissible limits. In some example embodiments, the one or more heat sources 20 may not be producing 'self-heat' but may receive heat from another heat producing elements that are inside or outside of the device. Examples of such passive heat sources may include a thermal duct, cold plates or a component that is thermally coupled with a heat generator. In some example embodiments, the one or more heat sources 20 may thus have or be associated with a thermal node in a thermal circuit, where the thermal node receives heat generated in the device. In this regard, the terms one or more heat sources and thermal node may be used interchangeably and may be represented using the same reference numeral (for example one or more heat sources 20 or thermal node 20) unless specified otherwise.

The one or more heat sinks 30 may correspond to sites, regions or components where heat can be disposed off to regulate the temperature of the hardware device. In some example embodiments, the one or more heat sinks 30 may correspond to passive heat exchangers used in electronic devices and radiators used with thermo-mechanical devices and systems. In some example embodiments, the one or more heat sinks 30 may correspond to components inside the device that require heating for proper functioning. In this regard, in some example embodiments, the one or more heat sinks 30 may include a battery or cell that provides electrical power for the device. In some example embodiments, the one or more heat sinks 30 may correspond to a housing of the device.

The one or more thermal bridges 40 may serve as heat transfer paths between the one or more heat sources 20 and the one or more heat sinks 30. In this regard, the one or more thermal bridges 40 comprises one or more high heat conductive elements such as copper, silver, Beryllium oxide. or Boron arsenide. In some example embodiments, the one or more thermal bridges 40 may include poly-metal (bimetal, trimetal, tetrametal and the like). The thermal bridge 40 may be multi-pronged in shape to serve as a heat transfer path between multiple heat sources and multiple heat sinks. In operation, coupling and decoupling of the one or more thermal bridges 40 may be controlled to cause heat transfer between desired heat source(s) and desired heat sink(s). Thus, the thermal bridge(s) 40 may be thermally couplable with the heat source(s) 20 and the heat sink(s) 30.

The thermal controller 50 controls coupling and decoupling of the one or more thermal bridges 40 with the one or more heat sources 20 and/or the one or more heat sinks 30. Such coupling and decoupling control may be performed by the thermal controller 50 in response to the environment temperature of the thermal controller 50. In some example embodiments, the thermal controller 50 may be realized using a thermally sensitive deformable body that expands significantly beyond a desired temperature and contracts significantly below another desired temperature. A detailed description of such an embodiment is provided later with reference to FIGS. 2A-2C. In some example embodiments, the desired temperatures may be set according to a standard operating range of one or more components of the hardware device.

To actuate the thermal bridge 40, the thermally sensitive deformable body may be placed in a position from where the movement of the thermally sensitive deformable body due to thermal expansion/contraction can be translated to movement of the thermal bridge 40. In such an arrangement, when the environment temperature of the thermal controller exceeds an upper limit of the standard operating temperature range of the device, the thermally sensitive deformable body expands beyond a first limit to extend one arm of the thermal bridge 40 to couple with a first heat sink of the one or more heat sinks 30 such that heat flow inside the device is reduced and instead is directed to the first heat sink that disposes the heat to a suitable site. Similarly, when the environment temperature of the thermal controller falls less than a lower limit of the standard operating temperature range of the electronic component, the thermally sensitive deformable body contracts beyond a second limit to retract another arm of the thermal bridge 40 to couple with a second heat sink of the one or more heat sinks 30 such that heat flow is regulated to be within the device to provide heating effect to one or more components of the device.

In some example embodiments, the thermal controller 50 may be realized using an electro-mechanical arrangement including a temperature sensor and an electronically controller actuation mechanism. A detailed description of such an embodiment is provided later with reference to FIG. 3. In some example embodiments, the temperature sensor may provide a measure of the absolute temperature of the environment of the thermal controller. Alternately, in some embodiments, the temperature sensor may provide a differential measurement of the temperature of the environment of the thermal controller 50 relative to the temperature of the external environment of the device. In either case, in response to the temperature measurement from the temperature sensor, an electronic controller of the actuation mechanism controls movement of the one or more thermal bridges 40 in a manner similar to the one described above with reference to the thermally sensitive deformable body.

The example embodiments of the thermal control system illustrated herein provide an effective solution for thermal management and heat control in hardware devices. For example, thermally sensitive components such as batteries whose performance degrades rapidly with their change in temperature, may be protected against potential thermal damage and operational failure using the example thermal control system described herein. Further, the overall capacity and life of such thermally sensitive components is enhanced, thereby providing avenues for implementing such thermally sensitive components in environments where the operating conditions may encompass a region outside the standard operating range of such thermally sensitive components. Thus, example embodiments described herein provide for an improvement in the operability, performance and life of a device equipped with the exemplar thermal control system described herein. These and several other improvements will become evident through a detailed description of the example embodiments described subsequently.

FIG. 2A illustrates an example thermal control system embodied in a device, in accordance with an example embodiment of the present disclosure. Specifically, FIG. 2A illustrates an embodiment of a thermal control system having a thermal controller realized using a thermally sensitive deformable body 110. In this embodiment, the thermal control system is embodied as a part of an electronic device 100. A housing 102 of the electronic device 100 encloses a heat source 104, a thermally sensitive component 106, a thermal bridge 108, and a thermally sensitive deformable body 110. The housing 102 may include a metal enclosure in part or full. The housing 102 may or may not be the outer body of the device 100. The heat source 104 may be a heat producing element such as an electronic component that consumers electrical power for operation. In some example embodiments, the heat source 104 may be one or more of a power amplifier, CPU, Integrated circuit and the like. The heat source 104 produces heat during operation which requires proper disposal to regulate temperature of the electronic device 100 and prevent damage to other components such as the thermally sensitive component 106.

The thermally sensitive component 106 may be any component whose structure, composition or performance is impacted if the temperature of the device 100 (also referred to as environment temperature of the device 100) is outside an operating temperature range of the component 106. One such example of the thermally sensitive component 106 may be a battery such as a Lithium ion battery. Such batteries are widely used in electronic gadgets such as mobile handheld devices. For such handheld devices, battery capacity is a key factor determining the duration for which the device can work constantly. The addition of new functionalities has ever fueled the demand for more battery capacity for such devices. Retaining the rated battery capacity at temperature extremes is desired for such batteries to support seamless operation for the electronic device in all weather conditions. For effective thermal management of such thermally sensitive components as the battery, it is desired that the temperature of such components be maintained within the working range even when the temperature of the environment in which the device 100 is operated lies outside the working range.

In some example embodiments, the thermally sensitive component 106 may be an electronic component of a circuitry. Some non-limiting examples of such electronic components may include SMT aluminum capacitors, tantalum ceramic capacitors, crystals, oscillators, fuses and the like. Due to high sensitivity to heat, these electronic components may cease operations or operate abnormally if the temperature of the device that includes these components is not regulated to be within the working range defined by the most sensitive component and the least sensitive component.

When the device 100 is operated in an environment whose temperature is near or below a lower limit of the working range of the component 106, the device 100 may be deemed to be operated in cold conditions. This is depicted in FIG. 2B which illustrates a working example of a thermal control system in cold conditions, in accordance with an example embodiment of the present disclosure. In some example embodiments, when the device 100 is operated in cold conditions, the thermally sensitive component 106 may be supplied with heat to prevent deterioration in the performance of the component 106.

When the device 100 is operated in an environment whose temperature is near or higher than an upper limit of the working range of the component 106, the device may be deemed to be operated in hot conditions. This is depicted in FIG. 2C which illustrates a working example of the thermal control system in hot conditions, in accordance with an example embodiment of the present disclosure. In some example embodiments, when the device 100 is operated in hot conditions the component 106 may require heat extraction to prevent damage to the component 106. The heat transfer to or from the thermally sensitive component 106 may be controlled using the thermally sensitive deformable body 110 via one or more bridges such as the thermal bridge 108.

In the example embodiment shown in FIG. 2A, the thermal bridge 108 may be a Y-shaped bridge having three arms. Although, FIG. 2A shows a single thermal bridge in the device 100, it may be contemplated that within the scope of this disclosure, there may be more number of such bridges to provide heat transfer between a source and sink, as the requirement may be. Thermal bridge 108 includes a first arm 108A and a second arm 108B commonly protruding from a third arm 108C. The third arm 108C may be thermally latched to the heat source 104 by any suitable technique. For example, the third arm 108C may be riveted, welded or fastened to the heat source 104 to provide direct contact between the thermal bridge 108 and the heat source 104. In some example embodiments, the third arm 108C may be latched to a surface or a heat plate of the heat source 104 using a suitable medium between the third arm 108C and the heat source 104. Such an indirect latching mechanism may be beneficial for repairs and routine maintenance of the thermal bridge 108 and/or the heat source 104. In either case, the latching of the third arm 108C with the heat source 104 provides an effective heat transfer path for heat dissipate from the heat source 104. In some example embodiments, the third arm 108C may serve as a thermal node which is configured to receive heat generated in the device 100 and only the first arm 108A and second arm 108B may be considered as part of the thermal bridge 108 in such example embodiments.

In some example embodiments, the first arm 108A of the thermal bridge 108 may extend from the third arm 108C towards a surface of the housing 102 of the device 100 such that a proximal end of the first arm 108A is connected to the third arm 108C while a distal end of the first arm 108A may form a surface that is thermally couplable with the housing 102 of the device 100. In a mirrored manner, the second arm 108B of the thermal bridge 108 may extend from the third arm 108C towards the thermally sensitive component 106 such that a proximal end of the second arm 108B is connected to the third arm 108C while a distal end of the second arm 108B may form a surface that is thermally couplable with the thermally sensitive component 106 of the device 100.

A thermal controller realized using a thermally sensitive deformable body 110 may be positioned between the first arm 108A and the second arm 108B of the thermal bridge 108 such that an expansion/contraction of the thermally sensitive deformable body 110 translates to movement of the first arm 108A and/or the second arm 108B. In some example embodiments, three sizes of the thermally sensitive deformable body 110 may be defined due to thermal expansion and contraction. At room temperatures, for example at around 25° C., the thermally sensitive deformable body 110 may have a shape defined by the surface 110A. The outline of the surface 110A shown in bold line may correspond to a mean position of the thermally sensitive deformable body 110. When the environment temperature of the thermally sensitive deformable body 110 decreases from the room temperature, the thermally sensitive deformable body 110 starts contracting. During the course of its contraction due to fall in environment temperature, the thermally sensitive deformable body 110 may reach and even shrink further from a shape defined by the surface 110B. The outline of the surface 110B shown in discrete dashed line may correspond to a first extreme position of the thermally sensitive deformable body 110. When the environment temperature of the thermally sensitive deformable body 110 increases, the thermally sensitive deformable body 110 starts expanding. During the course of its expansion due to rise in environment temperature, the thermally sensitive deformable body 110 may reach and even cross a shape defined by the surface 110C. The outline of the surface 110C shown in fine dashed line may correspond to a second extreme position of the thermally sensitive deformable body. Hereinafter, the indicia 110A, 110B, and 110C may also be used to refer to the mean position, the first extreme position, and the second extreme position, respectively of the thermally sensitive deformable body 110.

The choice of the material for the thermally sensitive deformable body 110 and its size depends upon the coefficient of thermal expansion of the thermally sensitive deformable body 110 and the limits of the working temperature range of the thermally sensitive component 106. In some example embodiments, when the shape of the thermally sensitive deformable body 110 is spherical, circular or near circular, the thermally sensitive deformable body 110 may be isotropic so that the change in size of the thermally sensitive deformable body 110 due to thermal expansion/contraction is uniform in all directions. In example embodiments, where the thermally sensitive deformable body 110 is planar, the thermally sensitive deformable body 110 may be anisotropic so that the change in size of the thermally sensitive deformable body 110 due to thermal expansion/contraction is non-uniform in all directions. In such embodiments, the thermally sensitive deformable body 110 may be designed in such a manner that the change in size due to thermal expansion/contraction along a direction parallel to the direction of movement of the thermal bridge 108 is substantially more than the change in size due to thermal expansion/contraction in any other direction. In some example embodiments, the thermally sensitive deformable body 110 comprises one or more of Polybutylene or Polyethylene.

The final dimension ($D_f$) of the thermally sensitive deformable body may be expressed in terms of the initial dimension ($D_0$) of the thermally sensitive deformable body 110 and change in temperature ($\Delta T$) as:

$$D_f = D_0(1 + n\alpha\Delta T)$$

where $\alpha$ is the coefficient of thermal expansion of the thermally sensitive deformable body 110 and n corresponds to the dimension's degree in cartesian coordinates (for length n=1, area n=2, volume n=3). The thermally sensitive deformable body 110 may have a high coefficient of thermal expansion so that even for a small change in temperature, the change in dimension is significantly perceivable so as to actuate the thermal bridge 108. In some non-limiting example embodiments, the thermally sensitive deformable body 110 may have a coefficient of thermal expansion of more than $100 \times 10^{-6}$ $K^{-1}$.

Using the knowledge of the working temperature range of the thermally sensitive component 106, the thermally sensitive deformable body 110 can be designed such that the dimension in the mean position 110A of the thermally sensitive deformable body 110 corresponds to a temperature within the working temperature range of the thermally sensitive component 106, the dimension in the first extreme position 110B of the thermally sensitive deformable body 110 corresponds to a temperature below or near the lower limit of the working temperature range of the thermally sensitive component 106, and the dimension in the second extreme position 110C of the thermally sensitive deformable body 110 corresponds to a temperature near or greater than an upper limit of the working temperature range of the thermally sensitive component 106. In this way, the thermally sensitive deformable body 110 expands and contracts relative to the limits of the thermally sensitive component 106.

Referring to the example embodiment illustrated in FIG. 2A, when the environment temperature of the thermally sensitive component 106 is within the working range, the thermally sensitive deformable body 110 is at or substantially near the mean position 110A. In this position, no heat exchange may be required between the heat source 104 and the thermally sensitive component 106. As such, the second arm 108B of the thermal bridge 108 is thermally decoupled from the thermally sensitive component 106 and the first arm of the thermal bridge 108 may or may not be coupled with the housing 102. That is, at room temperature, if the rate of heat produced by the heat source 104 exceeds the rate of self-cooling of the device 100, the first arm 108A of the thermal bridge may be designed to be in contact with the housing 102 to dispose the heat from the heat source 104 to out of the device 100 through the housing 102. If however, at the room temperature, the rate of heat produced by the heat source 104 is less than or equal to the rate of self-cooling of the device 100, the first arm 108A of the thermal bridge may be designed to not be in contact with the housing 102.

When the environment temperature of the thermally sensitive deformable body 110 is below the lower limit of the thermally sensitive component 106, the thermally sensitive deformable body 110 contracts such that it is at or substantially near the first extreme position 110B. This is illustrated in FIG. 2B where the first extreme position 110B is shown as a continuous line. At this position, it is desired that heat be supplied to the thermally sensitive component 106 to maintain the temperature of the thermally sensitive component 106 within the working range. Use of external or auxiliary heat sources may require additional power which can further reduce the available battery capacity. Accordingly, the heat from the heat source 104 may instead be utilized to heat the thermally sensitive component 106. Thus, in the example embodiment illustrated in FIG. 2B, when the thermally sensitive deformable body 110 reaches the first extreme position 110B, the second arm 108B of the thermal bridge 108 is retracted towards the thermally sensitive deformable body 110 near the proximal end. This causes the second arm 108B to thermally couple with the thermally sensitive component 106 to provide a heat transfer path between the heat source 104 and the thermally sensitive component 106. Contraction of the thermally sensitive deformable body 110 also causes the first arm 108A of the thermal bridge 108 to retract and drawn closer to the thermally sensitive deformable body 110 near the proximal end. This causes the first arm 108 to thermally decouple with the housing 102 thus preventing any heat transfer from the heat source 104 to the housing 102.

When the environment temperature of the thermally sensitive deformable body 110 is higher than the upper limit of the thermally sensitive component 106, the thermally sensitive deformable body 110 expands such that it is at or substantially near the second extreme position 110C. This is illustrated in FIG. 2C where the second extreme position 110C is shown as a continuous line. At this position, it is desired that heat be removed from the device 100 to regulate the temperature of the device 100 to prevent thermally induced damage to the thermally sensitive component 106 and to maintain the temperature of the thermally sensitive component 106 within the working range. In some example embodiments, the thermally sensitive component 106 may have a good self-cooling profile (that is it can cool on its own owing to structural, material or design factors). As such, use of additional sinks may not be desired and only heat transfer out of the device 100 may be sufficient to ensure safe operations. As illustrated in FIG. 2C, the expansion of the thermally sensitive deformable body 110 exerts a force on the first arm 108A. This causes the first arm 108A to extend towards the housing 102 such that when the thermally sensitive deformable body 110 is at or substantially near the second extreme position 110C, the first arm 108A is thermally coupled at the distal end with the housing 102 to provide a heat transfer path between the heat source 104 and the housing 102.

In some example embodiments, when high precision thermal control is desired, the thermal controller 50 of FIG. 1 may be realized using an electromechanical arrangement, a detailed description of which is provided next with reference to FIG. 3.

FIG. 3 illustrates an electromechanical thermal controller, in accordance with an example embodiment of the present disclosure. FIG. 3 is described with reference to FIGS. 1 and 2A-2C. For some thermally sensitive components 106, it may be desired that the actuation of the thermal bridge 108 occurs very precisely. In such cases, the thermal controller 50 is realized using a set up having a good response to temperature changes. Such a set up also provides the ability to configure the thermal controller 50 for different thermally sensitive components 106.

Referring to FIG. 3, the electromechanical thermal controller 50 includes a sensor module for sensing the environment temperature of the thermal controller 50 and an actuation mechanism for controlling actuation of the thermal bridge 108. The sensor module may be realized using a suitable temperature sensor 52. The actuation mechanism may include a motion driver such as a motor 54, a motion transmission system 56 and a controller 58. The controller 58 may control the operation of the motor 54 in response to the temperature measured by the temperature sensor 52. The motor 54 is rotationally coupled with the motion transmission system 56 in such a manner that the rotation of the rotor of the motor 54 is translated to linear motion of a first shaft 56A and a second shaft 56B. In this regard, the motion transmission system 56 may be realized using a suitable assembly of gears, dials and/or linkages such as the ones used in a rack and pinion actuator. In some example embodiments, the motor 54 may be a servo motor having rotational capabilities in both clockwise and anticlockwise directions. The controller 58 may be embodied as a central processing unit (CPU) comprising one or more processors and a memory, as one or more microcontroller units (MCU), as one or more of various hardware processing means such as a coprocessor, a microprocessor, or various other processing circuitry including integrated circuits such as, for example, an ASIC (application specific integrated circuit), an FPGA (field programmable gate array), a hardware accelerator, a special-purpose computer chip, or the like.

The first shaft 56A and the second shaft 56B may extend as well as retract relative to the motor 54. As shown in FIG. 3, the first shaft 56A is movable towards as well as away from the first arm 108A of the thermal bridge 108 while the second shaft is movable towards as well as away from the second arm 108B of the thermal bridge 108. Further, the motion transmission system 56 may have a mean position defined as the position at which the respective shaft maintains the first arm 108A or the second arm 108B, as the case may be, decoupled with the corresponding heat sink (housing 102 or thermally sensitive component 106). Similarly, the motion transmission system 56 may have a first extreme position defined as the position at which the first shaft maintains the first arm 108A decoupled with the housing 102 while the second shaft 56B maintains the second arm 108B coupled with the thermally sensitive component 106. As illustrated in FIG. 3, at the first extreme position of the motion transmission system 56, the first shaft 56A and the second shaft are shown in continuous lines. The motion transmission system 56 may have a second extreme position defined as the position at which the first shaft maintains the first arm 108A coupled with the housing 102 while the second shaft 56B maintains the second arm 108B decoupled with the thermally sensitive component 106. As illustrated in FIG. 3, at the second extreme position of the motion transmission system 56, the first shaft 56A and the second shaft are shown in dashed lines.

In some example embodiments, the temperature sensor 52 provides to the controller 58, a measurement of the environment temperature of the thermal controller 50. In some example embodiments, the temperature sensor 52 may provide an absolute measurement of the environment temperature. In some example embodiments, the temperature sensor 52 may provide a differential measurement of the environment temperature of the thermal controller 50 (i.e. relative to the environment temperature of the device 100). In some example embodiments, the temperature sensor 52 may provide a measurement of the environment temperature of the thermally sensitive component 106. In either case, in response to the received temperature measurement, the controller 58 may control the motor 54 to rotate along a desired direction by a calculated amount so that the first arm 108A and/or the second arm 108B are moved suitably to thermally couple or decouple with the housing 102 or the thermally sensitive element 106.

When the temperature as sensed by the temperature sensor 52 is within the working range of the thermally sensitive component 106, the first shaft 56A and the second shaft 56B are at or substantially near positions corresponding to the mean position of the motion transmission system 56. At this position, no heat exchange may be required between the heat source 104 and the thermally sensitive component 106. As such, the second arm 108B of the thermal bridge 108 is thermally decoupled from the thermally sensitive component 106 and the first arm of the thermal bridge 108 may or may not be coupled with the housing 102. That is, at room temperature, if the rate of heat produced by the heat source 104 exceeds the rate of self-cooling of the device 100, the first arm 108A of the thermal bridge may be designed to be in contact with the housing 102 to dispose the heat from the heat source 104 to out of the device 100 through the housing 102. If however, at the room temperature, the rate of heat produced by the heat source 104 is less than or equal to the rate of self-cooling of the device 100, the first arm 108A of the thermal bridge 108 may be designed to not be in contact with the housing 102.

When the temperature as sensed by the temperature sensor 52 is below the lower limit of the thermally sensitive component 106, the controller 58 drives the motor 54 in a manner that mimics contraction of the thermally sensitive deformable body 110. That is, the controller 58 drives the motor 54 in such a way that the first shaft 56A and the second shaft 56B are drawn towards the motor 54. This causes the second arm 108B of the thermal bridge 108 to retract towards the thermal controller 50 near the proximal end thereby thermally coupling the second arm 108B with the thermally sensitive component 106 to provide a heat transfer path between the heat source 104 and the thermally sensitive component 106. Movement of the first shaft 56A and the second shaft 56B towards the motor 54 also causes the first arm 108A of the thermal bridge 108 to retract and drawn closer to the thermal controller 50 near the proximal end. This causes the first arm 108 to thermally decouple with the housing 102 thus preventing any heat transfer from the heat source 104 to the housing 102.

When the temperature as sensed by the temperature sensor 52 is higher than the upper limit of the thermally sensitive component 106, the controller 58 drives the motor 54 in a manner that mimics expansion of the thermally sensitive deformable body 110. That is, the controller 58 drives the motor 54 in such a way that the first shaft 56A and the second shaft 56B are drawn away from the motor 54 towards the first arm 108A and the second arm 108B, respectively. This causes the second arm 108B of the thermal bridge 108 to extend away from the thermal controller 50 near the proximal end thereby thermally decoupling the second arm 108B with the thermally sensitive component 106. Movement of the first shaft 56A and the second shaft 56B away from the motor 54 also causes the first arm 108A of the thermal bridge 108 to extend towards the housing 102 which in turn causes the first arm 108 to thermally couple with the housing 102 to provide a heat transfer path between the heat source 104 and the housing 102.

In this way, example embodiments of the thermal control system provide for precision based thermal control for a hardware device. Although FIG. 3 illustrates the controller 58 operating in response to the temperature sensor 52, it may be contemplated that within the scope of this disclosure the thermally sensitive deformable body 110 may also be used instead of the temperature sensor 52 to stimulate operations of the controller 58. For example, the expansion and contraction of the thermally sensitive deformable body 110 may be used to drive one or more switches indicating logic levels corresponding to the upper limit and lower limit of the working temperature range of the thermally sensitive component 106. The controller 58 may interface with the one or more switches to control operations of the motor 54 and thereby cause coupling and/or decoupling of the first arm 108A and/or the second arm 108B.

FIG. 4 illustrates a working example of a thermal control system providing heat drain out of a device, in accordance with an example embodiment of the present disclosure. FIG. 4 shows an enhancement to the thermal control system described with reference to FIGS. 2A-2C. Accordingly, description of similar elements is omitted for the sake of brevity. In some example embodiments, the thermally sensitive component 106 may not have a good self-cooling profile (that is, sufficient cooling mechanism may not be available due to various reasons such as design constraints). As such, when the device 100 is operated in hot conditions, it may be desired that in addition to the heat source 104, heat is also extracted out from the thermally sensitive component 106 to regulate the temperature of the thermally sensitive component 106. A similar situation may arise when the thermally sensitive component 106 produces heat during operation. In such embodiments, the thermally sensitive component 106 may act as a heat source.

To address the aforementioned requirement, the device 100 may additionally include a thermal bridge 402 for the thermally sensitive component 106. The thermal bridge 402 may be movable such that the thermal bridge 402 thermally couples and decouples with the housing 102 based on thermal expansion and contraction, respectively of the thermally sensitive deformable body 110. In some example embodiments, a supporting structure 404 may engage the thermally sensitive deformable body 110 with the thermal bridge 402 to move the thermal bridge 402. The supporting structure 404 may comprise an insulating material having good tensile strength so as to prevent any heat transfer between the thermally sensitive deformable body 110 and the thermally sensitive component 106. When the environment temperature of the thermally sensitive deformable body 110 is higher than the upper limit of the working range of the thermally sensitive component 106, the thermally sensitive deformable body 110 expands in a manner similar to that described with reference to FIGS. 2A and 2C. The expansion of the thermally sensitive deformable body 110 causes the thermally sensitive deformable body 110 to be at or substantially near the second extreme position 110C shown as continuous line in FIG. 4. At this position, it is desired to remove heat from the heat source 104 as well as the thermally sensitive component 106. The thermal coupling of the first arm 108A with the housing 102 occurs in a manner similar to that discussed with reference to FIG. 2C to transfer heat from the heat source 104 to the housing 102. Further, as illustrated in FIG. 4, the expansion of the thermally sensitive deformable body 110 pushes on the supporting structure 404 which in turn moves the thermal bridge 402 towards the housing 102. This causes the thermal bridge 402 to thermally couple at the distal end with the housing 102 to provide a heat transfer path between the thermally sensitive component 106 and the housing 102. Thus, heat generated by the thermally sensitive component 106 is disposed off to the housing 102 and the temperature of the thermally sensitive component 106 is maintained within the working range.

FIG. 5 illustrates a flowchart depicting example operations of a process 500 for thermal control in a device, in accordance with an example embodiment of the present disclosure. The process 500 may be implemented by a thermal control system or a thermal control device similar to the one discussed with reference to FIG. 3. The process 500 includes at 502, sensing, by the temperature sensor 52, environment temperature of the thermal controller 50. Temperature sensor 52 may provide an absolute or differential measurement of the environment temperature of the thermal controller. In some example embodiments, the temperature sensor 52 may provide a measurement of the environment temperature of the thermally sensitive component 106.

Process 500 includes at 504, checking, by the controller 58, if the sensed environment temperature is greater than a first temperature threshold (Threshold 1). For example, the first temperature threshold may correspond to the upper limit of the working range of the thermally sensitive component 106. If the result of the check at 504 is positive (yes), the control of the process passes to step 506. At 506, the process 500 includes causing heat transfer from a thermal node to a first heat sink and preventing heat transfer from the thermal node to a second heat sink. The thermal node may correspond to a node that receives heat generated in the device (such as the device 100). In some example embodiments, the thermal node may be the heat source 104. In some example embodiments, the thermal node may be thermally latched to the heat source 104. The first heat sink may be a heat sink that dissipates or carries the heat out of the device. In some example embodiments, the first heat sink may correspond to the housing 102 of the device 100 illustrated in FIG. 2A. The second heat sink may be a heat sink that dissipates the heat to one or more thermally sensitive components in the device. For example, the second heat sink may correspond to the thermally sensitive component 106 of the device 100 illustrated in FIG. 2A.

In some example embodiments, in order to cause the heat transfer from the thermal node to the first heat sink, the controller 58 causes the first arm 108A of the thermal bridge 108 to extend towards the housing 102 of the device 100. This causes the first arm 108A to thermally couple with the housing 102 thereby providing a heat transfer path for the heat to transfer from the heat source 104 to the housing 102. In some example embodiments, in order to prevent the heat transfer from the thermal node to the second heat sink, the controller 58 causes the second arm 108B of the thermal bridge 108 to extend away from the thermally sensitive component 106 such that the second arm 108B is thermally decoupled with the thermally sensitive component 106 to cut-off any heat transfer path between the heat source 104 and the thermally sensitive component 106. Thus the heat transfer to the thermally sensitive component 106 is prevented.

If however, the result of the check at 504 is negative (no), process 500 proceeds to step 508. Process 500 at 508 includes checking if the sensed temperature is less than a second temperature threshold (Threshold 2). For example, the second temperature threshold may correspond to the lower limit of the working range of the thermally sensitive component 106. If the result of the check at 508 is negative (no), the control of the process returns to step 502 and the process 500 repeats. If however, the result of the check at step 508 is positive (yes), control passes to step 510. At 510, the process 500 includes causing heat transfer from a thermal node to the second heat sink and preventing heat transfer from the thermal node to the first heat sink.

In some example embodiments, in order to cause the heat transfer from the thermal node to the second heat sink, the controller 58 causes the second arm 108B of the thermal bridge 108 to retract towards the thermally sensitive component 106 of the device 100. This causes the second arm 108B to thermally couple with the thermally sensitive component 106 thereby providing a heat transfer path for the heat to transfer from the heat source 104 to the thermally sensitive component 106. In some example embodiments, in order to prevent the heat transfer from the thermal node to the first heat sink, the controller 58 causes the first arm 108A of the thermal bridge 108 to retract away from the housing 102 such that the first arm 108A is thermally decoupled with the housing 102 to cut-off any heat transfer path between the heat source 104 and the housing 102. Thus the heat transfer to the housing 102 is prevented.

In this way example embodiments of the thermal control process 500 provide effective and precise thermal control and management for regulating the temperature of a device to stay within a desired working range. The thermal control process 500 also provides an effective solution to the problems arising out of potential thermal damage to one or more components of the device and ensures the performance of the components is not compromised at least due to change in environment temperature of the device.

It will be understood that each block of the flowchart and combination of blocks in the flowchart illustrated above in FIG. 5 may be implemented by various means, such as hardware, firmware, circuitry, and/or other suitable devices. For example, one or more of the procedures described above may be embodied by computer program instructions. In this regard, the computer program instructions which embody the procedures described above may be stored by a memory device of an apparatus employing an embodiment of the present invention and executed by a processor of the thermal control system/device. Accordingly, blocks of the flowchart support combinations of means for performing the specified functions and combinations of operations for performing the specified functions/operations. It will also be understood that one or more blocks of the flowcharts, and combinations of blocks in the flowcharts, can be implemented by special purpose hardware. Embodiments of the subject matter and the operations described herein can be implemented using similar arrangements, mechanisms, assemblies, and/or electronic circuitry including the structures disclosed in this specification and their structural equivalents, or in combinations of one or more of them.

While this specification contains many specific implementation details, these should not be construed as limitations on the scope of any disclosures or of what may be claimed, but rather as descriptions of features specific to particular embodiments of particular disclosures. Certain features that are described herein in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while structures and operations are depicted in the drawings in a particular manner and order, this should not be understood as requiring that such operations be performed in the particular order shown or in sequential order, or that all illustrated operations be performed, to achieve desirable results, or the structures should only work in the manner described herein. Within the scope of the disclosures various modifications and alterations may be possible without departing from the objective. Moreover, the separation of various system components in the embodiments described above should not be understood as requiring such separation in all embodiments, and it should be understood that the described systems can generally be integrated together or further fragmented.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results.

I claim:

1. A thermal control system, comprising:
   a thermal node configured to receive heat generated in a device;
   a thermal bridge thermally coupled with the thermal node; and
   a thermal controller configured to:
      in response to an environment temperature of the thermal controller being greater than a first threshold temperature:
         cause heat transfer from the thermal node to a first heat sink by thermal coupling of the thermal bridge with the first heat sink; and
         prevent heat transfer from the thermal node to a second heat sink by thermal decoupling of the thermal bridge with the second heat sink; and
      in response to the environment temperature of the thermal controller being greater than a second threshold temperature:
         cause heat transfer from the thermal node to the second heat sink by thermal coupling of the thermal bridge with the second heat sink; and
         prevent heat transfer from the thermal node to the first heat sink by thermal decoupling of the thermal bridge with the first heat sink;
   wherein the thermal bridge comprises a first arm that includes a first end thermally coupled with the thermal node and a third end thermally couplable with the first heat sink;
   wherein the thermal bridge further comprises a second arm that includes a second end thermally coupled with the thermal node and a fourth end thermally couplable with the second heat sink;
   wherein the thermal controller comprises a thermally sensitive deformable body; and
   wherein the thermally sensitive deformable body is between the first arm of the thermal bridge and the second arm of the thermal bridge towards the first end of the first arm of the thermal bridge.

2. The thermal control system of claim 1, wherein the thermally sensitive deformable body comprises one or more of Polybutylene or Polyethylene.

3. The thermal control system of claim 1, wherein in response to the environment temperature of the thermally sensitive deformable body being greater than the first threshold temperature, the thermally sensitive deformable body is configured to expand such that the second end of the first arm is thermally coupled with the first heat sink to transfer heat from the thermal node to the first heat sink via the first arm of the thermal bridge.

4. The thermal control system of claim 3, wherein in response to the environment temperature of the thermally sensitive deformable body being greater than the first threshold temperature, the thermally sensitive deformable body is further configured to expand such that the fourth end of the second arm is thermally decoupled from the second heat sink to prevent transfer of heat from the thermal node to the second heat sink via the second arm of the thermal bridge.

5. The thermal control system of claim 1, wherein in response to the environment temperature of the thermally sensitive deformable body being less than the second threshold temperature, the thermally sensitive deformable body is configured to contract such that the fourth end of the second arm is thermally coupled with the second heat sink to transfer heat from the thermal node to the second heat sink via the second arm of the thermal bridge.

6. The thermal control system of claim 5, wherein in response to the environment temperature of the thermally sensitive deformable body being less than the second threshold temperature, the thermally sensitive deformable body is further configured to contract such that the second end of the first arm is thermally decoupled from the first heat sink to prevent heat transfer from the thermal node to the first heat sink via the first arm of the thermal bridge.

* * * * *